(12) United States Patent
Tashiro et al.

(10) Patent No.: US 11,947,260 B2
(45) Date of Patent: Apr. 2, 2024

(54) SAMPLE SUPPORT

(71) Applicant: HAMAMATSU PHOTONICS K.K., Hamamatsu (JP)

(72) Inventors: Akira Tashiro, Hamamatsu (JP); Masahiro Kotani, Hamamatsu (JP); Takayuki Ohmura, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 0 days.

(21) Appl. No.: 17/913,211

(22) PCT Filed: Jan. 14, 2021

(86) PCT No.: PCT/JP2021/001075
§ 371 (c)(1),
(2) Date: Sep. 21, 2022

(87) PCT Pub. No.: WO2021/199573
PCT Pub. Date: Oct. 7, 2021

(65) Prior Publication Data
US 2023/0131548 A1    Apr. 27, 2023

(30) Foreign Application Priority Data

Mar. 31, 2020    (JP) .................. 2020-063689

(51) Int. Cl.
*H01J 40/04* (2006.01)
*G03F 7/004* (2006.01)
(Continued)

(52) U.S. Cl.
CPC .............. *G03F 7/09* (2013.01); *G03F 7/0044* (2013.01); *G03F 7/162* (2013.01); *H01J 49/0418* (2013.01)

(58) Field of Classification Search
CPC ...... H01J 49/0418; G03F 7/09; G03F 7/0044; G03F 7/162
(Continued)

(56) References Cited

U.S. PATENT DOCUMENTS

2005/0045815 A1    3/2005    Bui
2006/0171849 A1    8/2006    Granger et al.
(Continued)

FOREIGN PATENT DOCUMENTS

JP    2003-510776 A    3/2003
JP    2004-354376 A    12/2004
(Continued)

OTHER PUBLICATIONS

International Preliminary Report on Patentability dated Oct. 13, 2022 for PCT/JP2021/001075.

*Primary Examiner* — Todd M Epps
(74) *Attorney, Agent, or Firm* — Faegre Drinker Biddle & Reath LLP

(57) ABSTRACT

A sample support includes: a substrate having a plurality of through-holes opening on a first surface and on a second surface; a first member having a plurality of first openings and disposed on the first surface; a second member having a plurality of second openings and disposed on the second surface, and; a bonding member disposed between the first member and the second member; and a conductive layer integrally provided on a region of the second surface corresponding to each of the plurality of second openings. The plurality of through-holes include a plurality of first through-holes located between each of the plurality of first openings and each of the plurality of second openings, and a plurality of second through-holes located between the first member and the second member. Each of the plurality of second
(Continued)

openings communicate with each of the plurality of first openings through the plurality of first through-holes.

12 Claims, 12 Drawing Sheets

(51) Int. Cl.
*G03F 7/09* (2006.01)
*G03F 7/16* (2006.01)
*H01J 49/04* (2006.01)

(58) Field of Classification Search
USPC ................................................ 250/282, 288
See application file for complete search history.

(56) References Cited

U.S. PATENT DOCUMENTS

| | | | | |
|---|---|---|---|---|
| 2022/0157587 A1* | 5/2022 | Kotani | ................ | H01J 49/0409 |
| 2022/0157588 A1* | 5/2022 | Kotani | ................ | H01J 49/0418 |
| 2022/0199387 A1* | 6/2022 | Kotani | ................ | H01J 49/0418 |
| 2022/0223396 A1* | 7/2022 | Tashiro | ................ | H01J 49/161 |
| 2023/0253196 A1* | 8/2023 | Tashiro | ............... | H01J 49/0418 |
| | | | | 250/282 |
| 2023/0290625 A1* | 9/2023 | Ikeda | ................ | H01J 49/0031 |
| | | | | 250/288 |

FOREIGN PATENT DOCUMENTS

| | | |
|---|---|---|
| JP | 2007-192673 A | 8/2007 |
| JP | 2014-021048 A | 2/2014 |
| JP | 2016-121968 A | 7/2016 |
| JP | 6539801 B1 | 7/2019 |
| JP | 2019-138759 A | 8/2019 |
| JP | 2019-194604 A | 11/2019 |
| JP | 2020-020587 A | 2/2020 |
| WO | WO-01/023863 A2 | 4/2001 |
| WO | WO-2019/058783 A1 | 3/2019 |
| WO | WO-2019/058857 A1 | 3/2019 |
| WO | WO-2020/026629 A1 | 2/2020 |

* cited by examiner

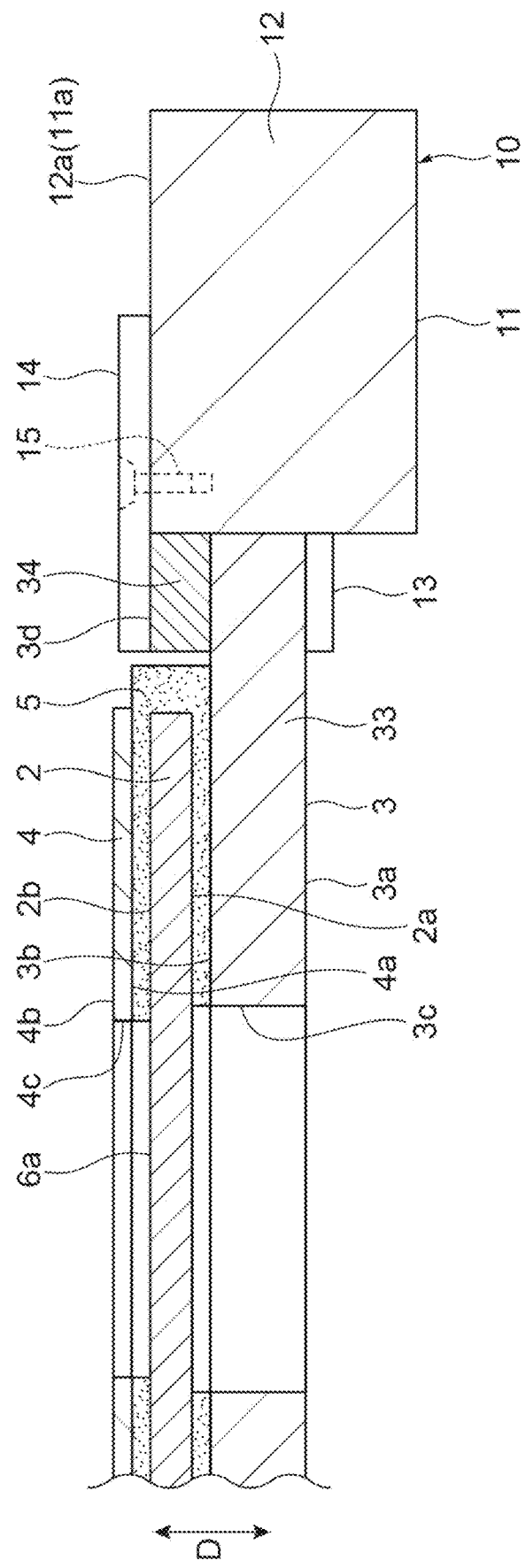

SAMPLE SUPPORT

TECHNICAL FIELD

The present disclosure relates to a sample support.

BACKGROUND ART

As a sample support used for ionizing a component of a sample, a sample support has been known which includes a substrate having a first surface, a second surface on a side opposite to the first surface, and a plurality of through-holes that are open on the first surface and on the second surface; a base bonded to the first surface of the substrate; and a conductive layer provided on the second surface of the substrate, and in which a plurality of openings are formed in the base (for example, refer to Patent Literature 1). In such a sample support, each of a plurality of regions of the substrate corresponding to the plurality of openings can be used as a measurement region.

CITATION LIST

Patent Literature

Patent Literature 1: Japanese Patent No. 6539801

SUMMARY OF INVENTION

Technical Problem

In the case of manufacturing the above-described sample support, when the first surface of the substrate and the base are bonded together, if a bonding member reaches the second surface of the substrate through the through-holes of the substrate before being cured, when the conductive layer is provided on the second surface of the substrate, outgas is generated from the conductive layer and from the bonding member, and a mixed layer caused by the outgas is deposited on the substrate, which is a concern. When the mixed layer is deposited on the substrate, noise caused by the mixed layer is generated in mass spectrometry, which is a concern.

Therefore, an object of the present disclosure is to provide a sample support that makes highly accurate mass spectrometry possible.

Solution to Problem

According to the present disclosure, there is provided a sample support for ionizing a component of a sample, the support including: a substrate having a first surface, a second surface on a side opposite to the first surface, and a plurality of through-holes opening on the first surface and on the second surface; a first member having a plurality of first openings and disposed on the first surface; a second member having a plurality of second openings and disposed on the second surface, each of the plurality of second openings corresponding to each of the plurality of first openings in a thickness direction of the substrate; a bonding member disposed between the first member and the second member, and bonding the substrate and at least one of the first member and the second member; and a conductive layer integrally provided on a region of the second surface corresponding to each of the plurality of second openings, on a surface of the second member on a side opposite to the substrate, and on an inner surface of each of the plurality of second openings. The plurality of through-holes include a plurality of first through-holes located between each of the plurality of first openings and each of the plurality of second openings, and a plurality of second through-holes located between the first member and the second member. Each of the plurality of second openings communicates with each of the plurality of first openings through the plurality of first through-holes.

In the sample support, each of the plurality of second openings of the second member communicates with each of the plurality of first openings of the first member through the plurality of first through-holes of the substrate. Accordingly, each of a plurality of the regions of the substrate corresponding to each of the plurality of second openings can be used as a measurement region. Here, when the sample support is manufactured, the substrate, the first member, and the second member can be unitized using the bonding member, and thereafter, the conductive layer can be provided from a second member side. Accordingly, when the conductive layer is provided from the second member side, since the bonding member is disposed between the first member and the second member, outgas is unlikely to be generated from the conductive layer and the bonding member and, as a result, a mixed layer caused by the outgas can be prevented from being deposited on the substrate. As a result, according to this sample support, highly accurate mass spectrometry is possible.

In the sample support of the present disclosure, the bonding member may be disposed in the plurality of second through-holes. According to this configuration, when each of the plurality of regions of the substrate corresponding to the plurality of second openings is used as the measurement region, each of a plurality of the measurement regions is isolated by the bonding member. For this reason, when the sample is disposed in each of the plurality of measurement regions, the movement of the sample between the measurement regions adjacent to each other is suppressed. Therefore, highly accurate mass spectrometry can be performed in each of the measurement regions.

In the sample support of the present disclosure, the bonding member may bond the first member and the substrate between the plurality of first openings and bond the second member and the substrate between the plurality of second openings. According to this configuration, as described above, when each of the plurality of regions of the substrate corresponding to the plurality of second openings is used as the measurement region, the movement of the sample between the measurement regions adjacent to each other is more reliably suppressed. Therefore, more highly accurate mass spectrometry can be performed in each of the measurement regions.

In the sample support of the present disclosure, each of the first member and the second member may be made of a metal material. According to this configuration, a voltage can be stably applied to the conductive layer provided in the region of the second surface of the substrate, the region corresponding to each of the plurality of second openings.

In the sample support of the present disclosure, the bonding member may have conductivity. According to this configuration, a voltage can be stably applied to the conductive layer provided in the region of the second surface of the substrate, the region corresponding to each of the plurality of second openings.

In the sample support of the present disclosure, the bonding member may be made of a photocurable material. For example, the bonding member may be made of an acrylic material or an epoxy material. According to this configuration, it is not necessary to perform a heat treatment for curing the bonding member. For this reason, even when a material that is greatly different in thermal expansion coefficient from a material of the substrate is used for at least one of the first member and the second member, the generation of bending caused by the heat treatment can be avoided.

The sample support of the present disclosure may further include at least one of a plurality of first markers and a plurality of second markers, each of the plurality of first markers indicating each of the plurality of first openings when the first member is viewed from a side opposite to the substrate, each of the plurality of second markers indicating each of the plurality of second openings when the second member is viewed from a side opposite to the substrate. According to this configuration, when each of the plurality of regions of the substrate corresponding to each of the plurality of second openings is used as the measurement region, each of the plurality of measurement regions can be easily recognized by recognizing each of the plurality of first openings or each of the plurality of second openings.

In the sample support of the present disclosure, the first member may have a third surface on which the substrate is disposed, and a fourth surface located outside the substrate to face the same side as the third surface. A distance between a surface of the conductive layer on a side opposite to the substrate and the fourth surface may be smaller than a thickness of the substrate, the surface of the conductive layer is a surface of the conductive layer provided on the second surface. According to this configuration, when the sample support is mounted in a mass spectrometer using an adapter having a reference surface located on the same plane as a focal point of an energy ray such as laser light in the mass spectrometer, the focal point of the energy ray can be aligned with the surface of the conductive layer at a level less than the thickness of the substrate, by holding the first member with the adapter such that the reference surface of the adapter and the fourth surface of the first member are located on the same plane. For this reason, the focal point of the energy ray can be highly accurately aligned in the mass spectrometer.

In the sample support of the present disclosure, the fourth surface may extend to surround the substrate when viewed from the thickness direction. According to this configuration, the strength of the first member and consequently, the strength of the sample support can be improved. In addition, the first member can be easily and reliably held by the adapter described above.

In the sample support of the present disclosure, an outer edge each of the plurality of second openings may be located inside an outer edge each of the plurality of first openings when viewed from the thickness direction. In a case where a region of the substrate in which the first opening and the second opening overlap each other when viewed from the thickness direction is used as the measurement region, for example, when the outer edge of the second opening is located outside the outer edge of the first opening, a region defined by the outer edge of the second opening includes not only the measurement region but also other regions when the second member is viewed from the side opposite to the substrate. For this reason, it is difficult to identify a range of the measurement region, which is a concern. Here, according to the configuration where the outer edge of the second opening is located inside the outer edge of the first opening, when the second member is viewed from the side opposite to the substrate, a region defined by the outer edge of the second opening is the measurement region, so that a range of the measurement region can be easily identified by identifying the outer edge of the second opening.

In the sample support of the present disclosure, a thickness of the second member may be smaller than a thickness of the first member. According to this configuration, for example, when the sample support is mounted in the mass spectrometer using the adapter having the reference surface located on the same plane as the focal point of the energy ray such as laser light in the mass spectrometer, even though the second member protrudes from the reference surface of the adapter in a state where the first member is held by the adapter, the interference of the sample support with the mass spectrometer can be suppressed.

Advantageous Effects of Invention

According to the present disclosure, it is possible to provide the sample support that makes highly accurate mass spectrometry possible.

BRIEF DESCRIPTION OF DRAWINGS

FIG. 12 is a cross-sectional view of a part of a sample support and an adapter of a modification example.

DESCRIPTION OF EMBODIMENTS

Figure 1:
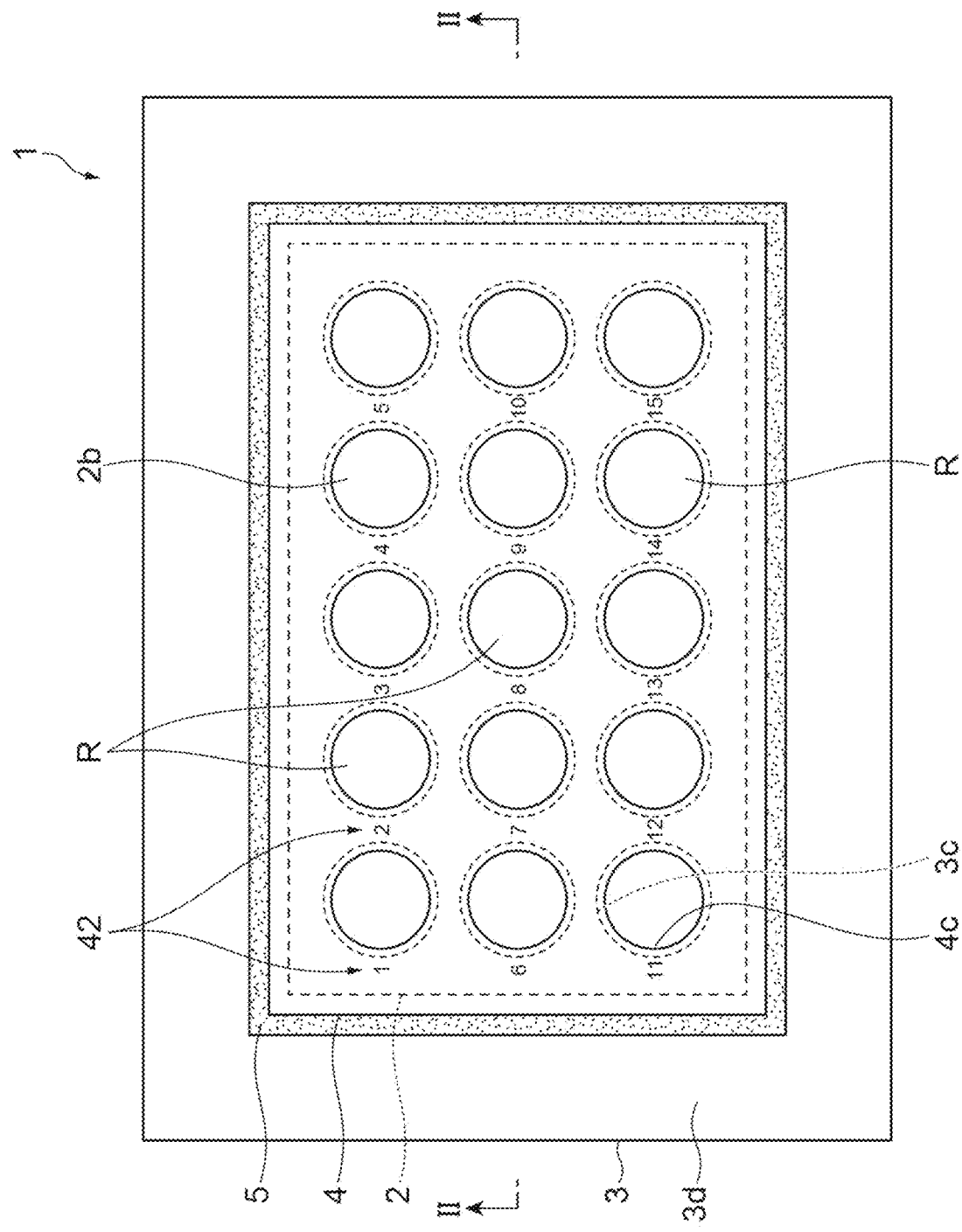
FIG. 1 is a plan view of a sample support of one embodiment.

Hereinafter, an embodiment of the present disclosure will be described in detail with reference to the drawings. Incidentally, in the drawings, the same or equivalent portions are denoted by the same reference signs, and a duplicated description will be omitted.

Figure 2:
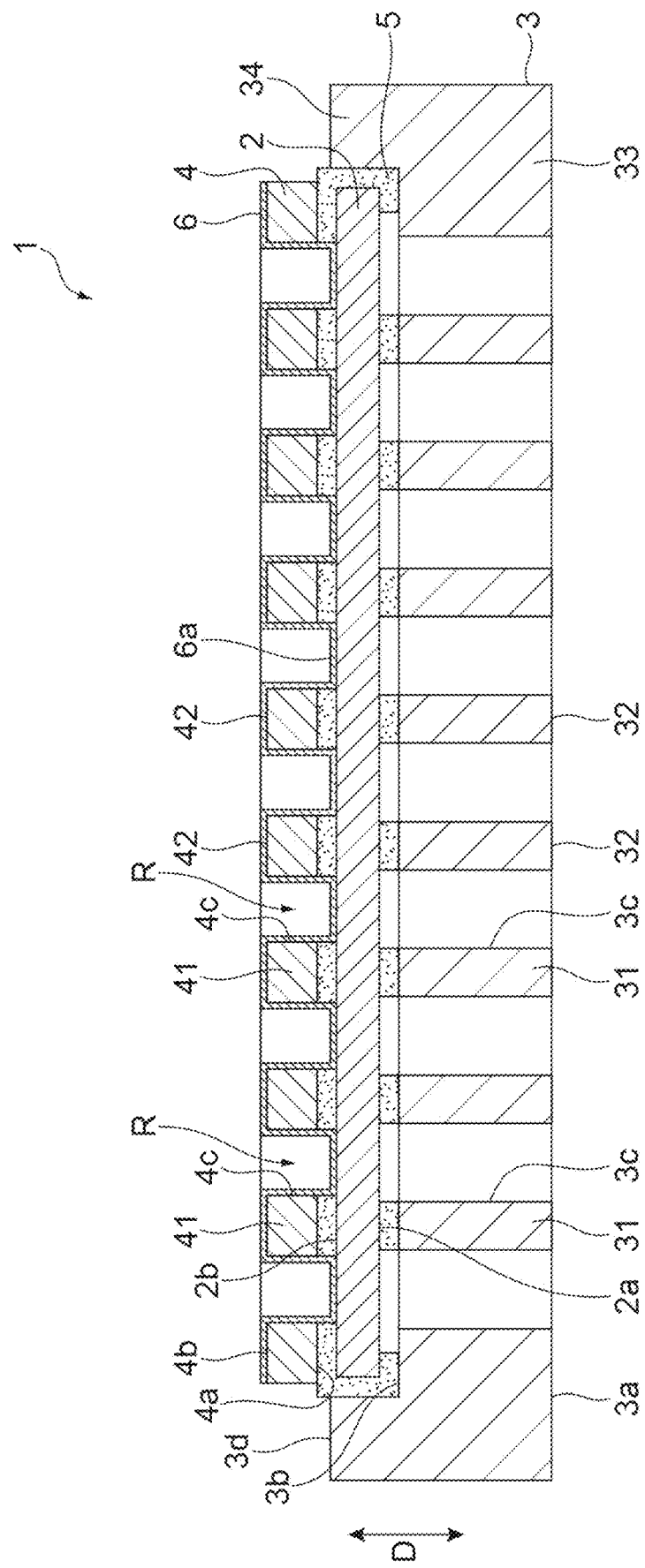
FIG. 2 is a cross-sectional view taken along line II-II shown in FIG. 1.
Figure 3:
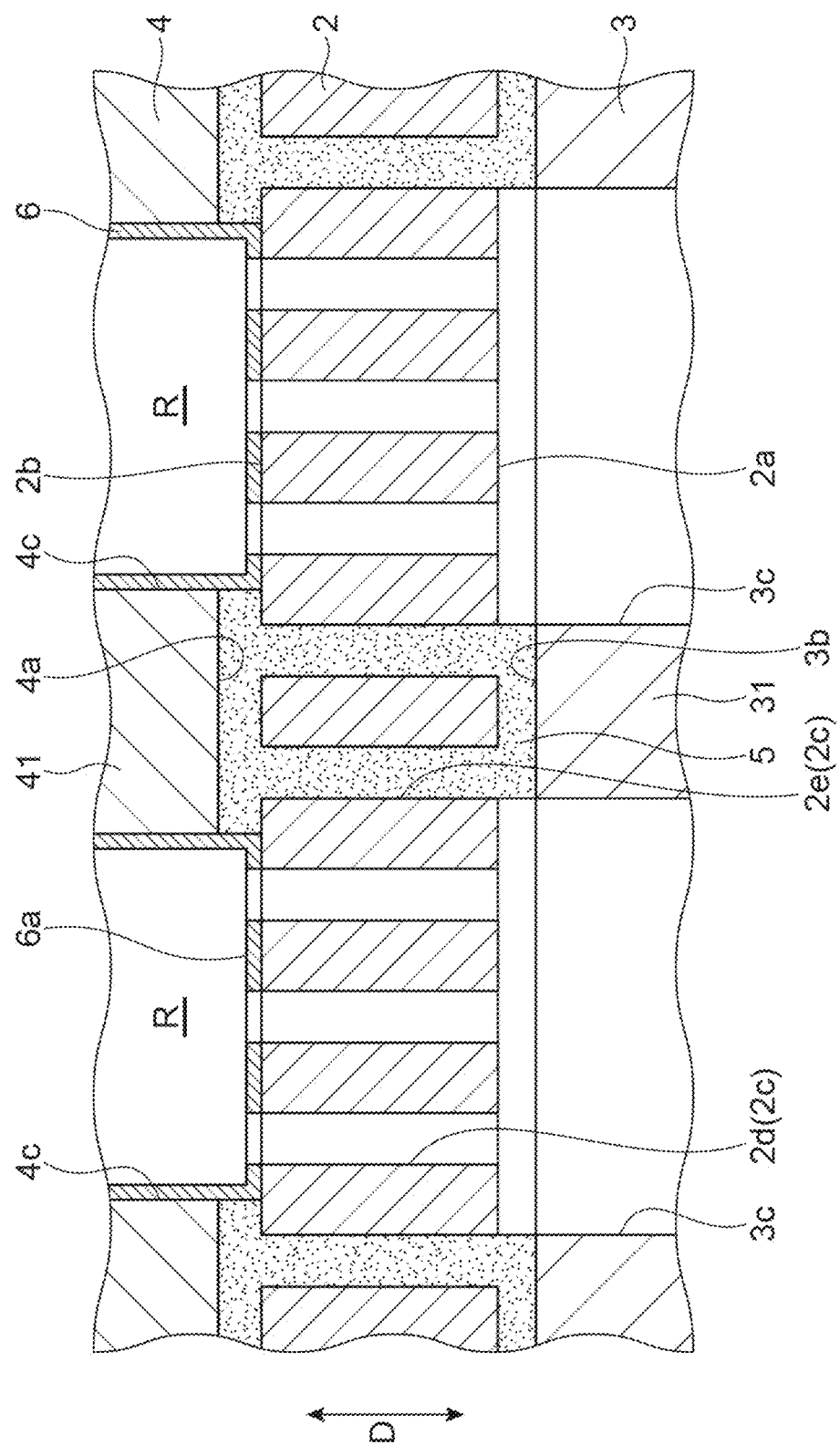
FIG. 3 is a partial enlarged view of the sample support shown in FIG. 2.

[Configuration of sample support] A sample support 1 shown in FIGS. 1 to 3 is used for ionizing a component of a sample. The sample support 1 includes a substrate 2, a base (first member) 3, a cover (second member) 4, a bonding member 5, and a conductive layer 6. The substrate 2 has a surface (first surface) 2a and a surface (second surface) 2b on a side opposite to the surface 2a. A plurality of through-holes 2c that are open on the surface 2a and on the surface 2b are formed in the substrate 2. Each of the through-holes 2c extends along a thickness direction D (hereinafter, simply referred to as a "direction D") of the substrate 2. The direction D is a direction in which the surface 2a and the surface 2b face each other.

For example, the substrate 2 is formed in a rectangular plate shape from an insulating material. A length of one side of the substrate 2 when viewed from the direction D is, for example, approximately several cm, and a thickness of the substrate 2 is, for example, 1 to 50 μm. A shape of each of the through-holes 2c when viewed from the direction D is, for example, a substantially circular shape, and a width of each of the through-holes 2c is, for example, 1 to 700 nm. The plurality of through-holes 2c each having a substantially constant width are uniformly (with a uniform distribution) formed in the substrate 2. An opening ratio of the through-holes 2c in a measurement region R (to be described later) (ratio of a region occupied by all the through-holes 2c to the measurement region R when viewed from the direction D) is practically 10 to 80%, particularly preferably 20 to 40%. Incidentally, the plurality of through-holes 2c may be irregular in the width of each of the through-holes 2c or the through-holes 2c may be partially connected to each other.

Figure 4:
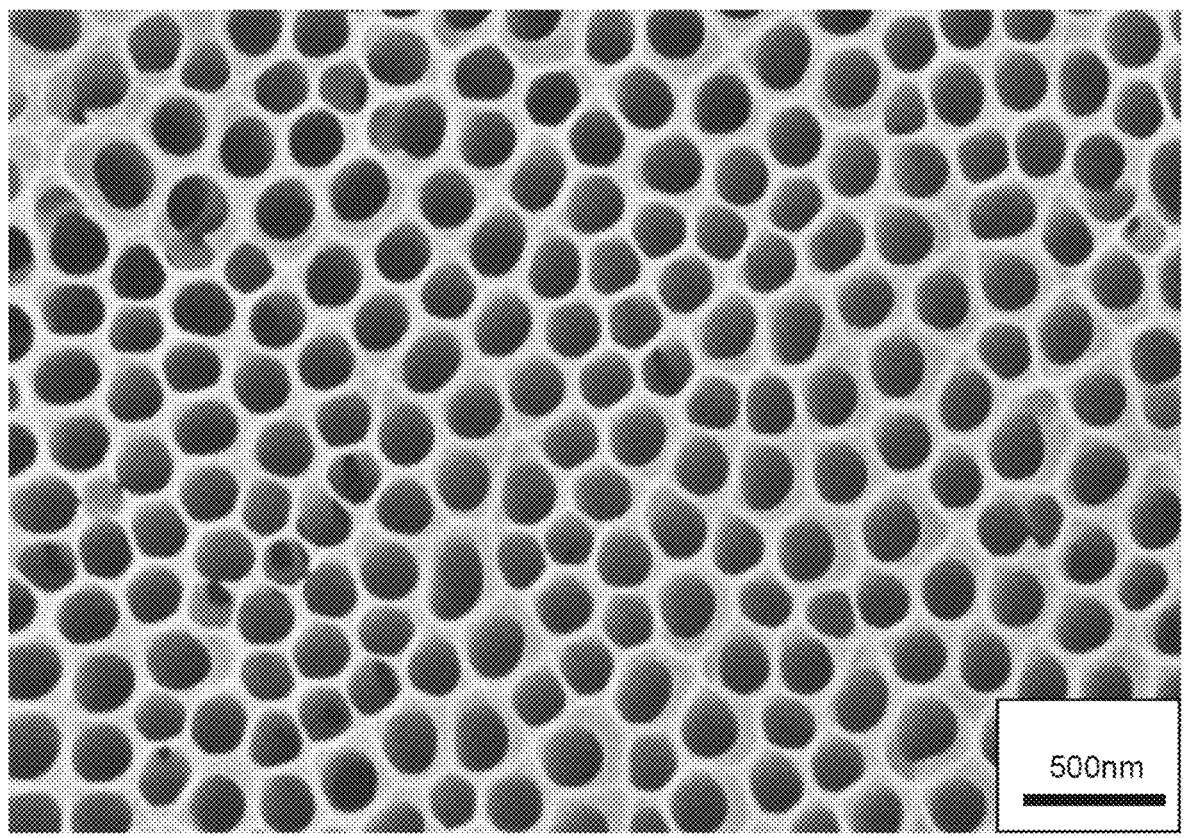
FIG. 4 is a view showing a SEM image of a surface of a substrate shown in FIG. 1.

The width of the through-holes 2c is a value obtained as follows. First, an image of each of the surface 2a and the surface 2b of the substrate 2 is acquired. FIG. 4 is a view showing a SEM image of the surface 2a of the substrate 2. In the SEM image, black portions are the through-holes 2c, and white portions are partition wall portions between the through-holes 2c. Subsequently, for example, binarization processing is performed on the acquired image of the surface 2a to extract a plurality of pixel groups corresponding to a plurality of openings (openings on a surface 2a side of the through-holes 2c) in the measurement region R, and a diameter of a circle having an average area of the openings is acquired based on the size per one pixel. Similarly, for example, binarization processing is performed on the acquired image of the surface 2b to extract a plurality of pixel groups corresponding to a plurality of openings (openings on a surface 2b side of the through-holes 2c) in the measurement region R, and a diameter of a circle having an average area of the openings is acquired based on the size per one pixel. Then, an average value of the diameter of the circle acquired for the surface 2a and the diameter of the circle acquired for the surface 2b is acquired as a width of the through-holes 2c.

The substrate 2 shown in FIG. 4 is an alumina porous film formed by anodizing aluminum (Al). Specifically, the substrate 2 can be obtained by performing an anodizing treatment on an Al substrate and by peeling off an oxidized surface portion from the Al substrate. Incidentally, the substrate 2 may be formed by anodizing a valve metal other than Al, such as tantalum (Ta), niobium (Nb), titanium (Ti), hafnium (Hf), zirconium (Zr), zinc (Zn), tungsten (W), bismuth (Bi), or antimony (Sb) or may be formed by anodizing silicon (Si).

As shown in FIGS. 1 and 2, the base 3 has a rectangular plate shape. The base 3 has a surface 3a and a surface (third surface) 3b on a side opposite to the surface 3a. A length of one side of the base 3 when viewed from the direction D is, for example, approximately several cm. When viewed from the direction D, an outer edge of the base 3 is located outside an outer edge of the substrate 2. A thickness (distance between the surface 3a and the surface 3b) of the base 3 is, for example, approximately 1 mm.

A plurality of openings (first openings) 3c arranged in a two-dimensional pattern (for example, a matrix pattern of 5 rows and 14 columns or the like) are formed in the base 3. Each of the plurality of openings 3c is defined by a partition wall portion 31 of the base 3. A shape of each of the openings 3c when viewed from the direction D is, for example, a circular shape, and in that case, a diameter of each of the openings 3c is, for example, approximately several mm to several tens of mm. The diameter of each of the openings 3c is, for example, approximately 3 mm.

The base 3 includes a body portion 33 and a protrusion portion 34. The body portion 33 and the protrusion portion 34 are integrally formed. The plurality of openings 3c are formed in the body portion 33. The protrusion portion 34 protrudes from the surface 3b at a peripheral edge of the body portion 33. The protrusion portion 34 has a rectangular ring shape when viewed from the direction D. Namely, a recessed portion defined by the surface 3b and the protrusion portion 34 is formed in the base 3. The protrusion portion 34 extends to surround the plurality of openings 3c when viewed from the direction D. The protrusion portion 34 has a surface (fourth surface) 3d facing the same side as the surface 3b. The surface 3d extends to surround the plurality of openings 3c when viewed from the direction D.

The base 3 is disposed on the surface 2a of the substrate 2. Specifically, the substrate 2 is disposed in the recessed portion of the base 3 such that the protrusion portion 34 is located outside the substrate 2. The substrate 2 is disposed on the surface 3b such that the surface 2a faces the surface 3b of the base 3. The protrusion portion 34 extends to surround the substrate 2 when viewed from the direction D. The surface 3d extends to surround the substrate 2 when viewed from the direction D.

The base 3 has conductivity. The base 3 is made of a metal material. The base 3 is made of, for example, a material having the same thermal expansion coefficient as that of the material of the substrate 2 or a material having a lower thermal expansion coefficient than that of the material of the substrate 2 (for example, an iron nickel alloy (42 alloy), molybdenum, kovar, titanium, or the like when the material of the substrate 2 is alumina). In the present embodiment, the material of the base 3 is an iron nickel alloy.

The sample support 1 includes a plurality of markers (first markers) 32. Each of the plurality of markers 32 indicates each of the plurality of openings 3c when the base 3 is viewed from a side opposite to the substrate 2. The plurality of markers 32 are provided on the surface 3a of the base 3 (surface of the base 3 on a side opposite to the substrate 2). Each of the plurality of markers 32 is provided to correspond one-to-one to each of the plurality of openings 3c. Each of the plurality of markers 32 is provided next to each of the plurality of openings 3c when viewed from the direction D. Each of the plurality of markers 32 is, for example, a number. Each of the plurality of markers 32 has such a width that each of the plurality of markers 32 can be visually recognized by a measurer. Each of the plurality of markers 32 is formed, for example, by forming protrusions and recesses in the surface 3a. Each of the plurality of markers 32 is provided, for example, by stamping or engraving using a laser.

The cover 4 has, for example, a rectangular plate shape. The cover 4 has a surface 4a and a surface 4b on a side opposite to the surface 4a. A length of one side of the cover 4 when viewed from the direction D is, for example, approximately several cm. When viewed from the direction D, an outer edge of the cover 4 is located outside the outer edge of the substrate 2. A thickness of the cover 4 is smaller than a thickness of the base 3. The thickness of the cover 4 is, for example, approximately 0.2 mm.

A plurality of openings (second openings) 4c arranged in a two-dimensional pattern (for example, a matrix pattern of 5 rows and 14 columns or the like) are formed in the cover 4. Each of the plurality of openings 4c is defined by a partition wall portion 41 of the cover 4. A shape of each of the openings 4c when viewed from the direction D is, for example, a circular shape, and in that case, a diameter of each of the openings 4c is, for example, approximately several mm to several tens of mm. The diameter of each of the openings 4c is smaller than the diameter of each of the openings 3c. The diameter of each of the openings 4c is, for example, approximately 2.5 mm.

The cover 4 is disposed on the surface 2b of the substrate 2. Specifically, the cover 4 is disposed such that the surface 4a of the cover 4 faces the surface 2b of the substrate 2. Each of the plurality of openings 4c of the cover 4 corresponds to each of the plurality of openings 3c of the base 3 in the direction D. Specifically, each of the plurality of openings 4c and each of the plurality of openings 3c face each other one-to-one in the direction D. A center line of each of the plurality of openings 4c and a center line of each of the plurality of openings 3c overlap each other. When viewed from the direction D, an outer edge of each of the plurality of openings 4c is located inside an outer edge of each of the plurality of openings 3c. Each of portions of the substrate 2 corresponds to each of regions in which each of the plurality of openings 4c and each of the plurality of openings 3c overlap each other when viewed from the direction D functions as the measurement region R for ionizing the sample. In the present embodiment, each of portions of the substrate 2 corresponding to the plurality of openings 4c functions as the measurement region R. When viewed from the direction D, each of the plurality of the measurement regions R is defined by the outer edge of each of the plurality of openings 4c.

The cover 4 has conductivity. The cover 4 is made of a metal material. The cover 4 is made of, for example, a material having the same thermal expansion coefficient as that of the material of the substrate 2 or a material having a lower thermal expansion coefficient than that of the material of the substrate 2 (for example, an iron nickel alloy (42 alloy), molybdenum, kovar, titanium, or the like when the material of the substrate 2 is alumina). In the present embodiment, the material of the cover 4 is an iron nickel alloy.

Incidentally, a material having the same thermal expansion coefficient as that of the material of the substrate 2 or a material having a lower thermal expansion coefficient than that of the material of the substrate 2 is used for at least one of the base 3 and the cover 4, so that the bending of the substrate 2 after bonding and sintering can be suppressed, and sufficient bonding between the substrate 2 and the sample and an improvement in sensitivity in mass spectrometry can be realized. When the sample support 1 is manufactured, the sample support 1 in which the conductive layer 6 is formed is sintered, so that the crystallinity of the conductive layer 6 can be improved, and the sample support 1 more suitable for mass spectrometry can be obtained.

The sample support 1 includes a plurality of markers (second markers) 42. Each of the plurality of markers 42 indicates each of the plurality of openings 4c when the cover 4 is viewed from a side opposite to the substrate 2. The plurality of markers 42 are provided on the surface 4b of the cover 4 (surface of the cover 4 on a side opposite to the substrate 2). Each of the plurality of markers 42 is provided to correspond one-to-one to each of the plurality of openings 4c. Each of the plurality of markers 42 is provided next to each of the plurality of openings 4c when viewed from the direction D. Each of the plurality of markers 42 is, for example, a number. Each of the plurality of markers 42 is provided to correspond one-to-one to each of the plurality of markers 32. Specifically, the marker 42 and the marker 32 corresponding to each other are provided next to the opening 4c and the opening 3c corresponding to each other, respectively. The marker 42 and the marker 32 corresponding to each other are the same number. Each of the plurality of markers 42 has such a width that each of the plurality of markers 42 can be visually recognized by a measurer. Each of the plurality of markers 42 is formed, for example, by forming protrusions and recesses in the surface 4b. Each of the plurality of markers 42 is provided, for example, by stamping or engraving using a laser.

As shown in FIG. 3, the plurality of through-holes 2c of the substrate 2 include a plurality of first through-holes 2d and a plurality of second through-holes 2e. The plurality of first through-holes 2d are located between each of the plurality of openings 3c and each of the plurality of openings 4c. Namely, each of the measurement regions R of the substrate 2 includes the plurality of first through-holes 2d. The plurality of second through-holes 2e are located between the base 3 and the cover 4. The plurality of second through-holes 2e are located between the partition wall portion 31 of the base 3 and the partition wall portion 41 of the cover 4. Each of the plurality of openings 3c and each of the plurality of openings 4c corresponding to each other communicates with each other through the plurality of first through-holes 2d.

As shown in FIGS. 2 and 3, the bonding member 5 is disposed between the base 3 and the cover 4. The bonding member 5 bonds the base 3 and the substrate 2 between the plurality of openings 3c and bonds the cover 4 and the substrate 2 between the plurality of openings 4c. The bonding member 5 is integrally (continuously) disposed in the plurality of second through-holes 2e, between the partition wall portion 31 of the base 3 and the substrate 2, between the partition wall portion 41 of the cover 4 and the substrate 2, and between a side surface of the substrate 2 and the protrusion portion 34 of the base 3. The bonding member 5 is covered with the cover 4 when viewed from the direction D. The bonding member 5 overlaps the partition wall portion 41 of the cover 4 when viewed from the direction D. The bonding member 5 is not exposed to each of the plurality of openings 4c.

The bonding member 5 has conductivity. The bonding member 5 may be made of a conductive adhesive agent or may be formed by applying a metal paste. The bonding member 5 is made of a UV curable material (photocurable material). The bonding member 5 is made of an acrylic material or an epoxy material. It is preferable that a bonding material that releases a small amount of gas (for example, an adhesive agent for use in vacuum or the like) is used as the material of the bonding member 5.

The conductive layer 6 is integrally (continuously) provided in a region of the surface 2b of the substrate 2, the region corresponding to each of the plurality of openings 4c of the cover 4 (namely, a region of the surface 2b of the substrate 2, the region corresponding to each of the plurality of measurement regions R), an inner surface of each of the plurality of openings 4c, and the surface 4b of the cover 4. The conductive layer 6 covers a region of the surface 2b of the substrate 2 in each of the measurement regions R, the plurality of through-holes 2c not being formed in the region. The conductive layer 6 covers the markers 42 on the surface 4b of the cover 4. However, since the markers 42 are formed by forming protrusions and recesses in the surface 4b, even when the markers 42 are covered with the conductive layer 6, the visual recognition of the markers 42 is not interfered with.

A surface 6a of the conductive layer 6 on a side opposite to the substrate 2 in each of the measurement regions R and the surface 3d of the protrusion portion 34 are located on the same plane (the same plane perpendicular to the direction D), the conductive layer 6 being formed on the surface 2b of the substrate 2. Namely, a distance between the surface 6a and the surface 3d in the direction D is 0 in the present embodiment and is smaller than the thickness of the substrate 2.

The conductive layer 6 is made of a conductive material. Meanwhile, it is preferable that as the material of the conductive layer 6, metal having a low affinity (reactivity) with the sample and a high conductivity is used for reasons to be described below. For example, when the conductive layer 6 is made of metal such as copper (Cu) having a high affinity with a sample such as a protein, in the process of ionization of the sample, the sample is ionized in a state where Cu atoms adhere to molecules of the sample and, as a result, the ionized sample is detected as Cu adducts, so that a detection result shifts, which is a concern. Therefore, it is preferable that metal having a low affinity with a sample is used as the material of the conductive layer 6.

On the other hand, the higher the conductivity of the metal is, the easier it is to apply a constant voltage easily and stably. For this reason, when the conductive layer 6 is made of metal having a high conductivity, a voltage can be uniformly applied to the surface 2b of the substrate 2 in the measurement region R. In addition, it is preferable that the material of the conductive layer 6 is metal capable of efficiently transmitting the energy of laser light with which the substrate 2 is irradiated, to the sample through the conductive layer 6. For example, when the sample is irradiated with standard laser light (for example, third harmonic Nd-YAG laser having a wavelength of approximately 355 nm, nitrogen laser having a wavelength of approximately 337 nm, or the like) used in matrix-assisted laser desorption/ionization (MALDI) or the like, it is preferable that the material of the conductive layer 6 is Al, gold (Au), platinum (Pt), or the like having a high absorptivity in the ultraviolet region.

From the above viewpoint, it is preferable that for example, Au, Pt, or the like is used as the material of the conductive layer 6. The conductive layer 6 is formed with a thickness of approximately 1 nm to 350 nm, for example, by a plating method, an atomic layer deposition (ALD) method, an evaporation method, a sputtering method, or the like. Incidentally, for example, chromium (Cr), nickel (Ni), titanium (Ti), or the like may be used as the material of the conductive layer 6.

Figure 5:
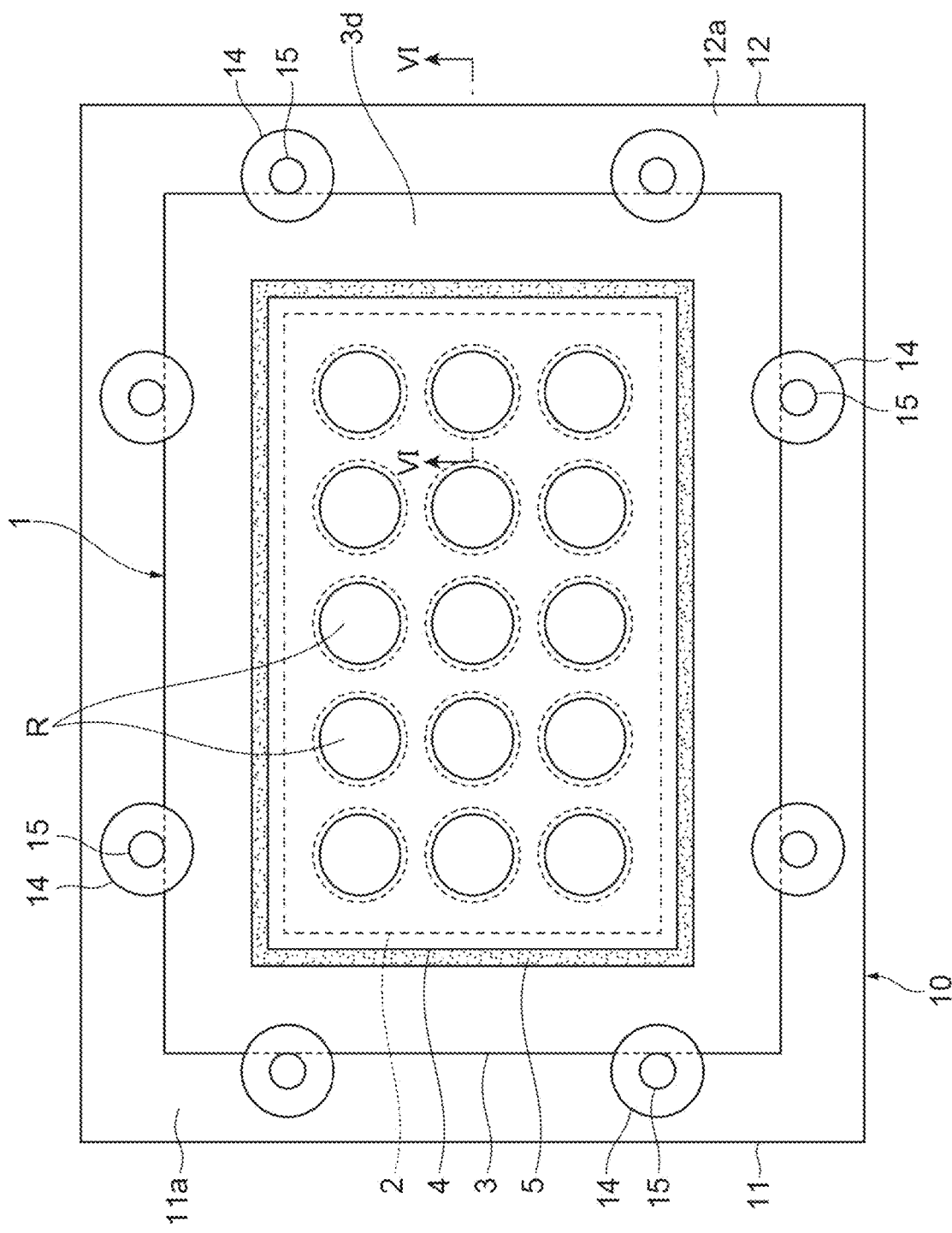
FIG. 5 is a plan view of the sample support and an adapter of one embodiment.
Figure 6:
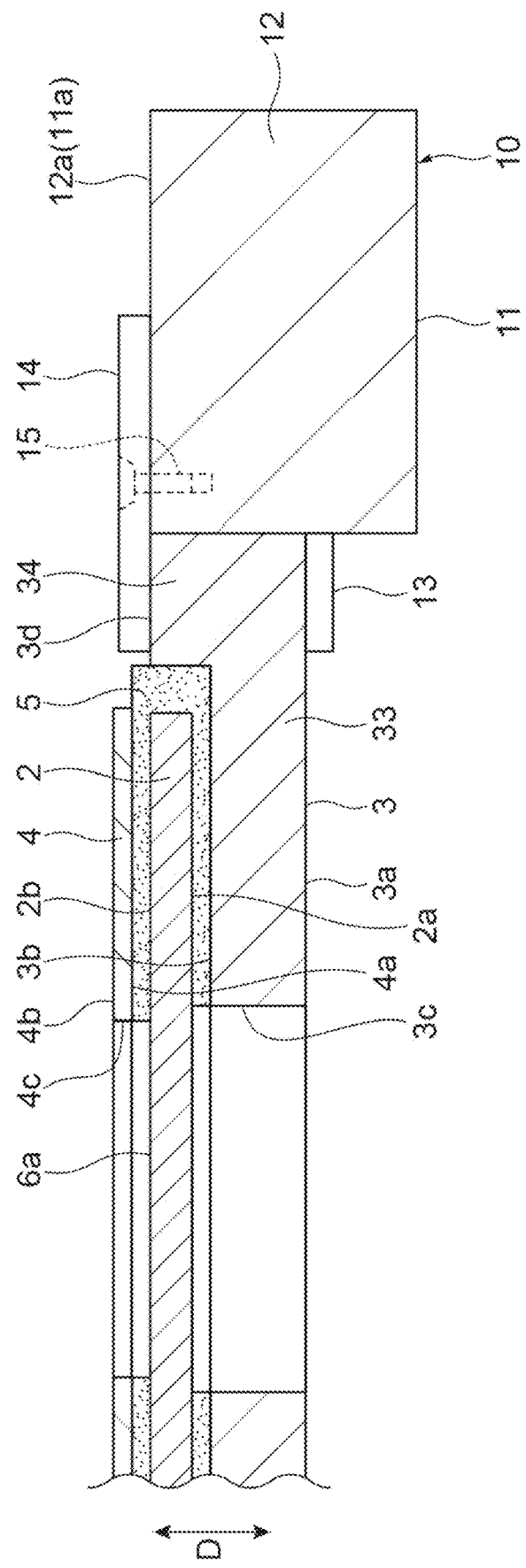
FIG. 6 is a cross-sectional view taken along line VI-VI shown in FIG. 5.

[Configuration of adapter] An adapter 10 shown in FIGS. 5 and 6 is used for mounting the sample support 1 described above in a mass spectrometer. The adapter 10 includes a holding unit 11. The holding unit 11 includes a body member 12, a plurality of stoppers 13, and a plurality of sets of washers 14 and bolts 15. For example, the body member 12 is formed in a rectangular frame shape from a metal material. The plurality of stoppers 13 are provided in the body member 12 to protrude to an inside of the body member 12. The plurality of sets of washers 14 and bolts 15 are attachable to and detachable from one surface 12a of the body member 12. In a state where the plurality of sets of washers 14 and bolts 15 are fixed to the surface 12a of the body member 12, a part of each of the washers 14 faces the corresponding stopper 13 at a predetermined distance in the direction D. The holding unit 11 has a reference surface 11a located on the same plane as a focal point of laser light in the mass spectrometer (the same plane parallel to an optical axis of the laser light). In the present embodiment, the reference surface 11a is the surface 12a of the body member 12. A distance between the surface 3a and the surface 3d of the base 3 in the direction D may be substantially equal to a predetermined distance between a part of each of the washers 14 and the corresponding stopper 13.

The sample support 1 is disposed on the plurality of stoppers 13, and in that state, the plurality of sets of washers 14 and bolts 15 are fixed to the surface 12a of the body member 12, so that the sample support 1 is held by the holding unit 11. In a state where the sample support 1 is held by the holding unit 11, the reference surface 11a of the holding unit 11 and the surface 3d of the base 3 are located on the same plane (the same plane parallel to the direction D and to the optical axis of the laser light). Namely, the holding unit 11 holds the base 3 such that the reference surface 11a of the holding unit 11 and the surface 3d of the base 3 are located on the same plane.

Figure 7:
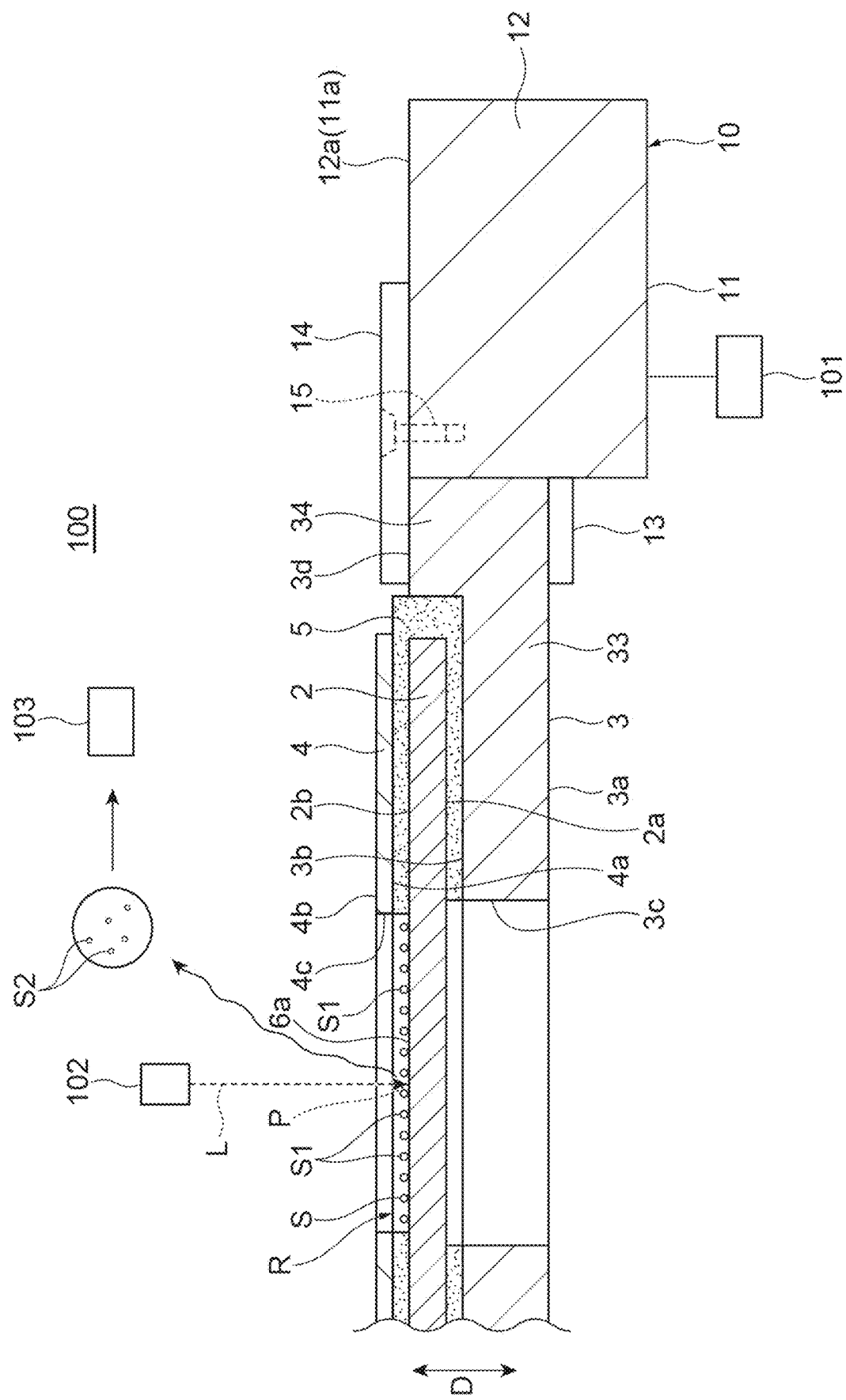
FIG. 7 is a view showing a mass spectrometry method of one embodiment.

[Ionization method and mass spectrometry method] An ionization method and a mass spectrometry method using the sample support 1 and the adapter 10 described above will be described with reference to FIG. 7. First, the sample support 1 is prepared. Subsequently, a sample S is disposed in each of the measurement regions R of the sample support 1. In the present embodiment, for example, a solution containing the sample S is dripped on each of the measurement regions R from the surface 2b side of the substrate 2. Accordingly, in each of the measurement regions R, the excessive solution infiltrates into the plurality of through-holes 2c, and a component S1 of the sample S is appropriately held on the conductive layer 6. Subsequently, the sample support 1 on which the sample S is disposed in each of the measurement regions R is mounted in a mass spectrometer 100 using the adapter 10.

Subsequently, a laser light irradiation unit 102 of the mass spectrometer 100 is operated to irradiate each of the measurement regions R with laser light (energy ray) L while applying a voltage to the conductive layer 6 of the sample support 1 through the adapter 10 by operating a voltage application unit 101 of the mass spectrometer 100. Accordingly, the component S1 of the sample S is ionized. At this time, since a focal point P of the laser light L and the reference surface 11a of the holding unit 11 are located on the same plane, the reference surface 11a of the holding unit 11 and the surface 3d of the base 3 are located on the same plane, and the surface 3d of the base 3 and the surface 6a of the conductive layer 6 are located on the same plane, the focal point P of the laser light L is located on the surface 6a of the conductive layer 6 on which the component S1 of the sample S is held. The above steps correspond to the ionization method (in the present embodiment, a laser desorption and ionization method) using the sample support 1 and the adapter 10.

Subsequently, sample ions S2 released by the ionization of the component S1 of the sample S (ionized component S1) are detected in an ion detection unit 103 of the mass spectrometer 100. Specifically, the released sample ions S2 move toward a ground electrode provided between the sample support 1 and the ion detection unit 103, in an accelerated manner because of a potential difference generated between the conductive layer 6 to which the voltage has been applied and the ground electrode, and are detected by the ion detection unit 103. In the present embodiment, the mass spectrometer 100 is a scanning type mass spectrometer using a time-of-flight mass spectrometry (TOF-MS) method. The above steps correspond to the mass spectrometry method using the sample support 1 and the adapter 10.

Incidentally, in FIGS. 1 and 5 to 7, the illustration of the conductive layer 6 is omitted. In addition, in FIGS. 1, 2, and 5 to 7, the illustration of the plurality of through-holes 2c is omitted. In addition, in FIGS. 1, 2, and 5, the illustration of some openings 3c and some openings 4c is omitted. Namely, in FIGS. 1, 2, and 5, the number of the openings 3c and the openings 4c is shown as being smaller than an actual number. In addition, in FIG. 3, the illustration of some first through-holes 2d and some second through-holes 2e is omitted. Namely, in FIG. 3, the number of the first through-holes 2d and the second through-holes 2e is shown as being smaller than an actual number.

[Actions and effects] As described above, in the sample support 1, each of the plurality of openings 4c of the cover 4 communicates with each of the plurality of openings 3c of the base 3 through the plurality of first through-holes 2d of the substrate 2. Accordingly, each of a plurality of regions of the substrate 2 corresponds to each of the plurality of openings 4c can be used as the measurement region R. Here, when the sample support 1 is manufactured, the substrate 2, the base 3, and the cover 4 can be unitized using the bonding member 5, and thereafter, the conductive layer 6 can be provided from a cover 4 side. Accordingly, when the conductive layer 6 is provided from the cover 4 side, since the bonding member 5 is disposed between the base 3 and the cover 4, outgas is unlikely to be generated from the conductive layer 6 and the bonding member 5 and, as a result, a mixed layer caused by the outgas can be prevented from being deposited on the substrate 2. As a result, according to the sample support 1, highly accurate mass spectrometry is possible.

Figure 8:
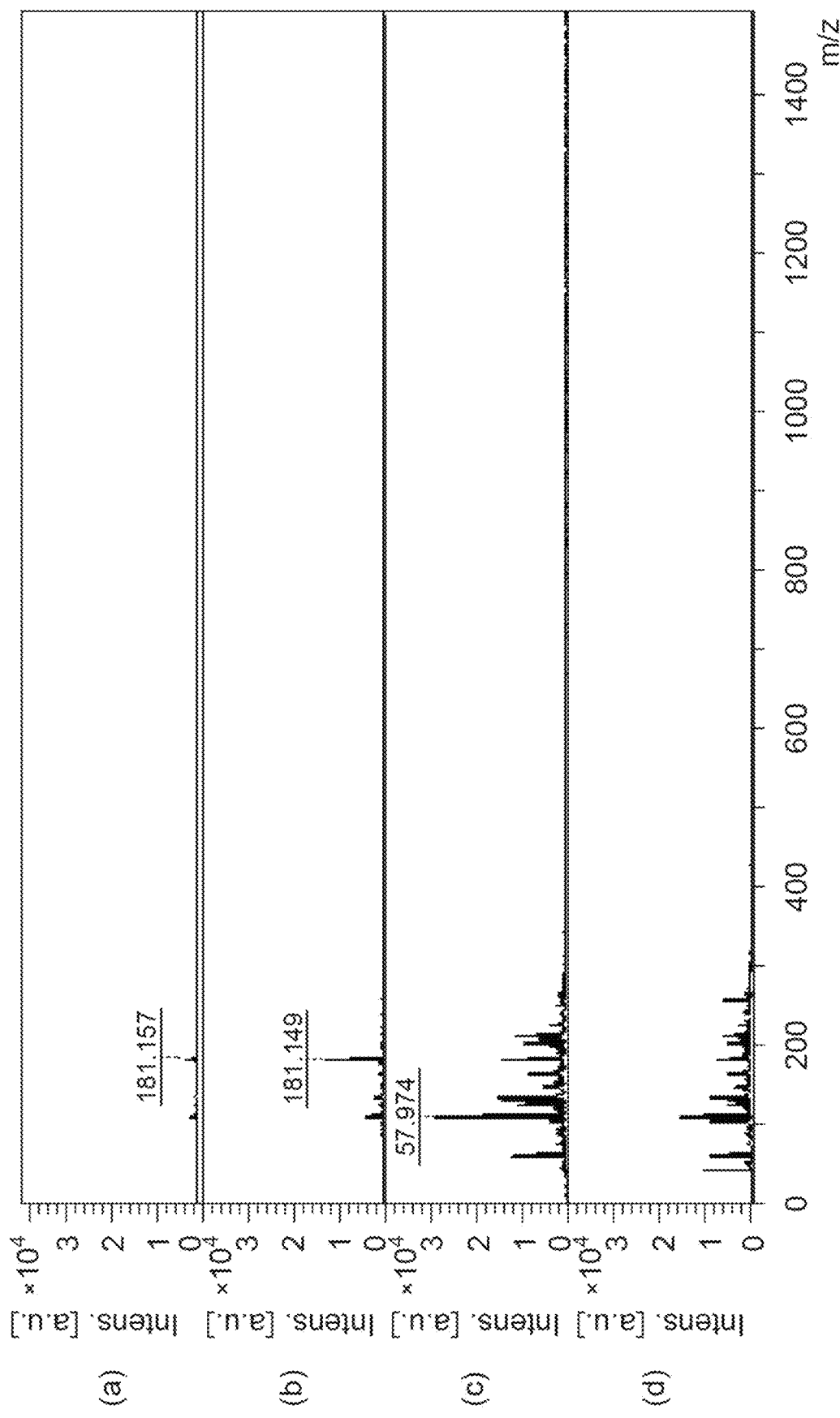
FIG. 8 is graphs showing mass spectra obtained by mass spectrometry methods each of a first example and a first comparative example.

(a) and (b) in FIG. 8 are graphs showing mass spectra obtained by a mass spectrometry method of a first example. (c) and (d) in FIG. 8 are graphs showing mass spectra obtained by a mass spectrometry method of a first comparative example. The sample support 1 is used in the mass spectrometry method of the first example. A sample support used in the mass spectrometry method of the first comparative example is different from the sample support 1 mainly in that the cover 4 is not provided. As shown in FIG. 8, in the first example, there is less noise in detected signal than in the first comparative example.

Figure 9:
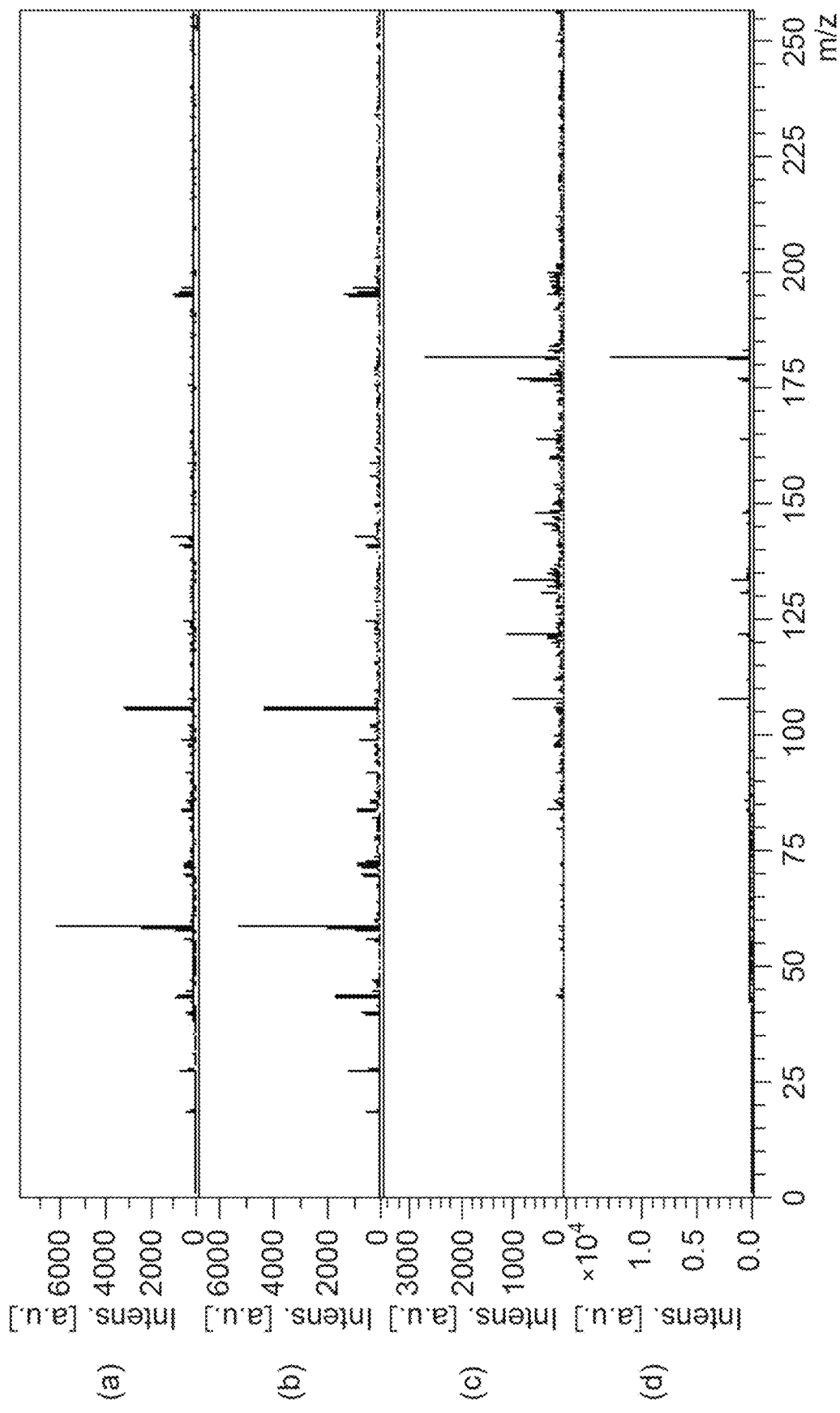
FIG. 9 is graphs showing mass spectra obtained by mass spectrometry methods each of a second comparative example, a second example, a third comparative example, and a third example.

(a) in FIG. 9 is a graph showing a mass spectrum obtained by a mass spectrometry method of a second comparative example. (b) in FIG. 9 is a graph showing a mass spectrum obtained by a mass spectrometry method of a second example. (c) in FIG. 9 is a graph showing a mass spectrum obtained by a mass spectrometry method of a third comparative example. (d) in FIG. 9 is a graph showing a mass spectrum obtained by a mass spectrometry method of a third example. The sample support 1 is used in the mass spectrometry method of each of the second example and the third example. A sample support used in the mass spectrometry method of each of the second comparative example and the third comparative example is different from the sample support 1 mainly in that the cover 4 is not provided. As shown in (a) and (b) in FIG. 9, in the second example, there is less noise in detected signal than in the second comparative example. As shown in (c) and (d) in FIG. 9, in the third example, there is less noise in detected signal than in the third comparative example.

In addition, in the sample support 1, the bonding member 5 is disposed in the plurality of second through-holes 3e. According to this configuration, when each of the plurality of regions of the substrate 2 corresponding to the plurality of openings 4c is used as the measurement region R, each of the plurality of measurement regions R is isolated by the bonding member 5. For this reason, when the sample S is disposed in each of the plurality of measurement regions R, the movement of the sample S between the measurement regions R adjacent to each other is suppressed. Therefore, highly accurate mass spectrometry can be performed in each of the measurement regions R.

In addition, in the sample support 1, the bonding member 5 bonds the base 3 and the substrate 2 between the plurality of openings 3c and bonds the cover 4 and the substrate 2 between the plurality of openings 4c. According to this configuration, as described above, when each of the plurality of regions of the substrate 2 corresponding to the plurality of openings 4c is used as the measurement region R, the movement of the sample S between the measurement regions R adjacent to each other is more reliably suppressed. Therefore, more accurate mass spectrometry can be performed in each of the measurement regions R.

In addition, in the sample support 1, each of the base 3 and the cover 4 is made of a metal material. According to this configuration, a voltage can be stably applied to the conductive layer 6 provided in the region of the surface 2b of the substrate 2, the region corresponding to each of the plurality of openings 4c.

In addition, in the sample support 1, the bonding member 5 has conductivity. According to this configuration, a voltage can be stably applied to the conductive layer 6 provided in the region of the surface 2b of the substrate 2, the region corresponding to each of the plurality of openings 4c.

In addition, in the sample support 1, the bonding member 5 is made of a UV curable material. The bonding member 5 is made of an acrylic material or an epoxy material. According to this configuration, it is not necessary to perform a heat treatment for curing the bonding member 5. For this reason, even when a material that is greatly different in thermal expansion coefficient from the material of the substrate 2 is used for at least one of the base 3 and the cover 4, the generation of bending caused by the heat treatment can be avoided.

In addition, the sample support 1 includes the plurality of markers 32 and the plurality of markers 42. Each of the plurality of markers 32 indicates each of the plurality of openings 3c when the base 3 is viewed from the side opposite to the substrate 2. Each of the plurality of markers 42 indicates each of the plurality of openings 4c when the cover 4 is viewed from the side opposite to the substrate 2. According to this configuration, when each of the plurality of regions of the substrate 2 corresponding to each of the plurality of openings 4c is used as the measurement region R, each of the plurality of measurement regions R can be easily recognized by recognizing each of the plurality of openings 3c and each of the plurality of openings 4c. A solution containing the sample S may be dripped on the measurement regions R from the surface 2a side of the substrate 2 depending on the type of the solution. Namely, when the substrate 2 has a higher affinity with the solution than the conductive layer 6, it is preferable that the solution is dropped from the surface 2a side of the substrate 2. Accordingly, the solution can more smoothly flow into the first through-holes 2d than when the solution is dripped from the surface 2b side of the substrate 2. In the present embodiment, since the sample support 1 includes both each of the plurality of markers 32 indicating each of the plurality of openings 3c, and each of the plurality of markers 42 indicating each of the plurality of openings 4c, when the solution is dripped from the surface 2a side of the substrate 2, the measurement regions R can be recognized by recognizing the openings 3c through the markers 32, and thereafter, when irradiation with the laser light L is performed, the measurement regions R can be recognized by recognizing the openings 4c through the markers 42.

In addition, in the sample support 1, the base 3 has the surface 3b on which the substrate 2 is disposed, and the surface 3d located outside the substrate 2 to face the same side as the surface 3b, and the distance between the surface 6a of the conductive layer 6 and the surface 3d is smaller than the thickness of the substrate 2. According to this configuration, when the sample support 1 is mounted in the mass spectrometer 100 using the adapter 10 having the reference surface 11a located on the same plane as the focal point P of the laser light L in the mass spectrometer 100, the focal point P of the laser light L can be aligned with the surface 6a of the conductive layer 6 at a level less than the thickness of the substrate 2, by holding the base 3 with the adapter 10 such that the reference surface 11a of the adapter 10 and the surface 3d of the base 3 are located on the same plane. For this reason, the focal point P of the laser light L can be highly accurately aligned in the mass spectrometer 100.

In addition, in the sample support 1, the protrusion portion 34 of the base 3 extends to surround the substrate 2 when viewed from the direction D. According to this configuration, the strength of the base 3 and consequently, the strength of the sample support 1 can be improved. In addition, the base 3 can be easily and reliably held by the adapter 10 described above.

In addition, in the sample support 1, the outer edge of each of the plurality of openings 4c is located inside the outer edge of each of the plurality of openings 3c when viewed from the direction D. In a case where a region of the substrate 2 in which the opening 3c and the opening 4c overlap each other when viewed from the direction D is used as the measurement region R, for example, when the outer edge of the opening 4c is located outside the outer edge of the opening 3c, a region defined by the outer edge of the opening 4c includes not only the measurement region R but also other regions when the cover 4 is viewed from the side opposite to the substrate 2. For this reason, it is difficult to identify a range of the measurement region R, which is a concern. Here, according to the configuration where the outer edge of the opening 4c is located inside the outer edge of the opening 3c, when the cover 4 is viewed from the side opposite to the substrate 2, a region defined by the outer edge of the opening 4c is the measurement region R, so that a range of the measurement region R can be easily identified by identifying the outer edge of the opening 4c.

In addition, in the sample support 1, the thickness of the cover 4 is smaller than the thickness of the base 3. According to this configuration, for example, when the sample support 1 is mounted in the mass spectrometer 100 using the adapter 10 having the reference surface 11a located on the same plane as the focal point P of the laser light L in the mass spectrometer 100, even though the cover 4 protrudes from the reference surface 11a of the adapter 10 in a state where the base 3 is held by the adapter 10, the interference of the sample support 1 with the mass spectrometer 100 can be suppressed.

Figure 10:
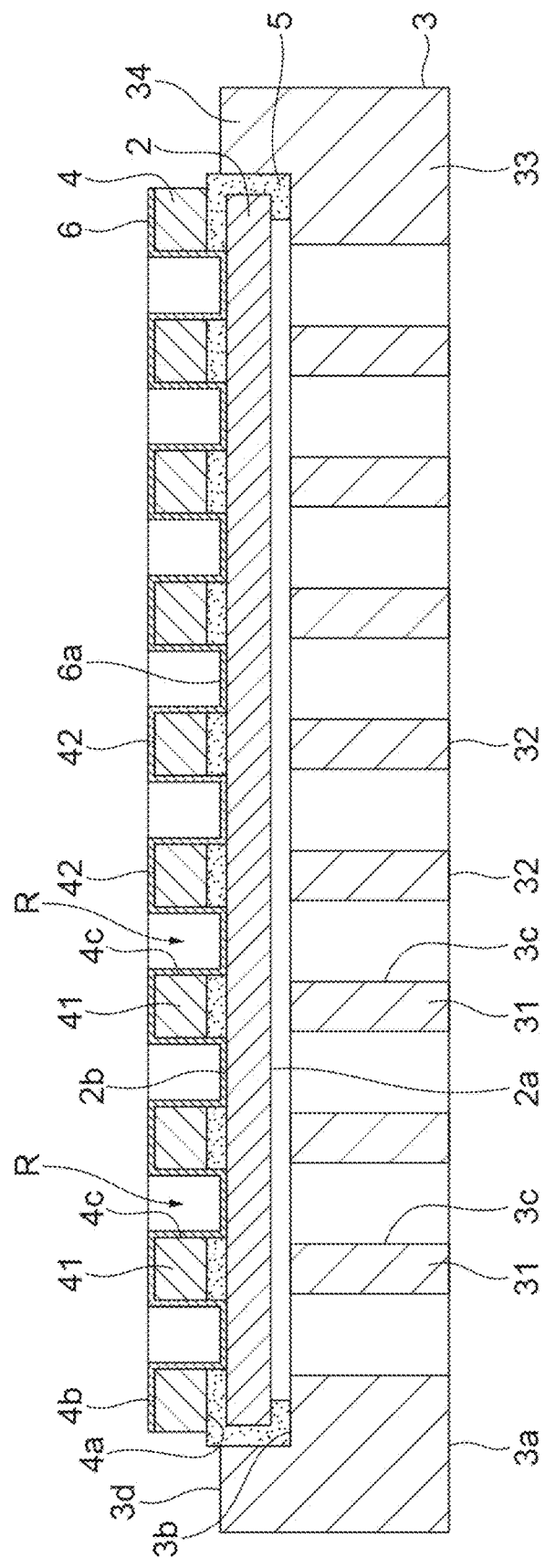
FIG. 10 is a cross-sectional view of a sample support of a modification example.
Figure 11:
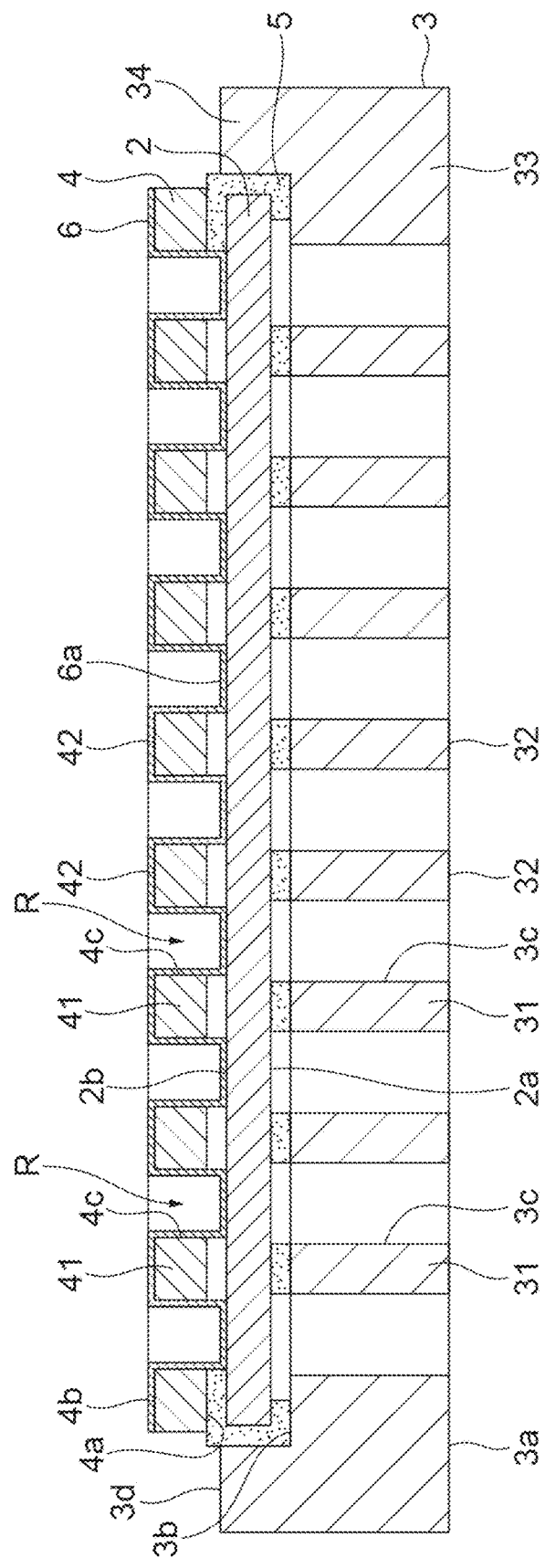
FIG. 11 is a cross-sectional view of a sample support of a modification example.

[Modification examples] An example has been provided in which the bonding member 5 bonds the base 3 and the substrate 2 between the plurality of openings 3c and bonds the cover 4 and the substrate 2 between the plurality of openings 4c, but the present disclosure is not limited to the example. As shown in FIG. 10, the bonding member 5 may not bond the base 3 and the substrate 2 between the plurality of openings 3c. Namely, the bonding member 5 may not be disposed between the partition wall portion 31 of the base 3 and the substrate 2 between the plurality of openings 3c. Incidentally, the bonding member 5 may be disposed or not disposed between the partition wall portion 31 of the base 3 and the substrate 2 outside the plurality of openings 3c (at an outer edge portion of the substrate 2). In addition, the bonding member 5 may be disposed or not disposed between the side surface of the substrate 2 and the protrusion portion 34 of the base 3. In addition, as shown in FIG. 11, the bonding member 5 may not bond the cover 4 and the substrate 2 between the plurality of openings 4c. Namely, the bonding member 5 may not be disposed between the partition wall portion 41 of the cover 4 and the substrate 2 between the plurality of openings 4c. Incidentally, the bonding member 5 may be disposed or not disposed between the partition wall portion 41 of the cover 4 and the substrate 2 outside the plurality of openings 4c (at the outer edge portion of the substrate 2). As described above, the bonding member 5 may be disposed between the base 3 and the cover 4 to bond the substrate 2 and at least one of the base 3 and the cover 4.

In addition, as long as the distance between the surface 6a of the conductive layer 6 and the surface 3d of the base 3 is smaller than the thickness of the substrate 2, the surface 6a of the conductive layer 6 and the surface 3d of the base 3 may not be located on the same plane perpendicular to the direction D. Even in this case, the focal point P of the laser light L can be aligned with the surface 6a of the conductive layer 6 at a level less than the thickness of the substrate 2, by holding the base 3 with the adapter 10 such that the reference surface 11a of the adapter 10 and the surface 3d of the base 3 are located on the same plane.

In addition, as long as the holding unit 11 of the adapter 10 can hold the base 3 such that the reference surface 11a of the adapter 10 and the surface 3d of the base 3 are located on the same plane, the present disclosure is not limited to the above-described configuration (namely, including the body member 12, the plurality of stoppers 13, and the plurality of sets of washers 14 and bolts 15).

In addition, an example has been provided in which the body portion 33 and the protrusion portion 34 of the base 3 are integrally formed, but as shown in FIG. 12, the body portion 33 and the protrusion portion 34 may be separately formed. In this case, the protrusion portion 34 may be made of, for example, an adhesive agent or evaporated metal.

In addition, an example has been provided in which the protrusion portion 34 (including the surface 3d) extends to surround the substrate 2 when viewed from the direction D, but the present disclosure is not limited to the example. The base 3 may include a plurality of the protrusion portions arranged along an outer edge of the substrate 2 when viewed from the direction D. Each of the plurality of protrusion portions corresponds to each of the plurality of sets of washers 14 and bolts 15.

In addition, the base 3 may not include the protrusion portion 34. Recessed portions (counterbores) each having substantially the same depth as a thickness of the protrusion portion 34 may be formed in the surface 12a of the body member 12. In this case, the sample support 1 is disposed on the plurality of stoppers 13, and in that state, the plurality of sets of washers 14 and bolts 15 are fixed to bottom surfaces of the recessed portions formed in the body member 12, so that the sample support 1 is held by the holding unit 11. Namely, the holding unit 11 holds the base 3 such that the bottom surfaces of the recessed portions formed in the body member 12 and the surface 3b of the base 3 are located on the same plane. Even in this case, the focal point P of the laser light L can be aligned with the surface 6a of the conductive layer 6 at a level less than the thickness of the substrate 2.

In addition, an example has been provided in which the bonding member 5 is made of a UV curable material, but the bonding member 5 may be made of an inorganic binder or the like. Examples of the inorganic binder include Ceramabond (registered trademark) manufactured by Audec Co., Ltd., Aron Ceramic (registered trademark) manufactured by TOAGOSEI CO., LTD., and the like.

In addition, an example has been provided in which each of the plurality of markers 32 is a number, but each of the plurality of markers 32 may be various markers. Each of the plurality of markers 32 may be at least one selected from, for example, a number, a symbol, and a character. Similarly, an example has been provided in which each of the plurality of markers 42 is a number, but each of the plurality of markers 42 may be various markers. Each of the plurality of markers 42 may be at least one selected from, for example, a number, a symbol, and a character.

In addition, an example has been provided in which each of the plurality of markers 32 is formed by forming protrusions and recesses in the surface 3a of the base 3, but each of the plurality of markers 32 may be formed by, for example, printing a character using printing such as nanoprinting, photolithography using extreme ultraviolet (EUV) exposure, writing with paint, blacking (oxidation) that is one example of engraving using a laser, or the like. Similarly, an example has been provided in which each of the plurality of markers 42 is formed by forming protrusions and recesses in the surface 4b of the cover 4, but each of the plurality of markers 42 may be formed by, for example, printing a character using printing such as nanoprinting, photolithography using extreme ultraviolet (EUV) exposure, writing with paint, blacking (oxidation) that is one example of engraving using a laser, or the like. Incidentally, when each of the plurality of markers 42 is not formed by forming protrusions and recesses in the surface 4b of the cover 4 and is covered with the conductive layer 6 so that visibility is interfered with, the conductive layer 6 is not formed in regions of the surface 4b of the cover 4, the plurality of markers 42 being formed in the regions.

In addition, an example has been provided in which each of the plurality of markers 32 is provided to correspond one-to-one to each of the plurality of openings 3c and is provided next to each of the plurality of openings 3c when viewed from the direction D, but each of the plurality of markers 32 may be arranged along rows and columns of the plurality of openings 3c outside the plurality of openings 3c. The plurality of markers 32 may form a coordinate system for identifying each of the plurality of openings 3c. Similarly, an example has been provided in which each of the plurality of markers 42 is provided to correspond one-to-one to each of the plurality of openings 4c and is provided next to each of the plurality of openings 4c when viewed from the direction D, but each of the plurality of markers 42 may be arranged along rows and columns of the plurality of openings 4c outside the plurality of openings 4c. The plurality of markers 42 may form a coordinate system for identifying each of the plurality of openings 4c.

In addition, an example has been provided in which each of the plurality of markers 32 is provided in the surface 3a of the base 3, but for example, when the conductive layer 6 is provided on the surface 3a of the base 3, each of the plurality of markers 32 may be provided in a surface of the conductive layer 6 provided on the surface 3a. An example has been provided in which each of the plurality of markers 42 is provided in the surface 4b of the cover 4, but each of the plurality of markers 42 may be provided in, for example, the surface 6a of the conductive layer 6, the surface 3d of the base 3, or the like.

In addition, an example has been provided in which a solution containing the sample S is dripped on each of the measurement regions R from the surface 2b side of the substrate 2, but the solution may be dripped on each of the measurement regions R from the surface 2a side of the substrate 2. As described above, when the substrate 2 has a higher affinity with the solution than the conductive layer 6, it is preferable that the solution is dripped from the surface 2a side of the substrate 2. Specifically, in a state where the sample support 1 is supported such that the surface 2a is located on an upper side with respect to the surface 2b, the solution is dripped on each of the measurement regions R from the surface 2a side. Thereafter, a state where the surface 2a is located on the upper side with respect to the surface 2b is maintained, so that the solution moves into the plurality of first through-holes 2d because of gravity and a capillary. Here, since the surface 2a has a higher affinity with the solution than the conductive layer 6, the solution can more smoothly flow into the first through-holes 2d when the solution is dripped onto the surface 2a than when the solution is dripped onto the surface 2b (conductive layer 6). Subsequently, the sample support 1 is inverted such that the surface 2b is located on the upper side with respect to the surface 2a, and the sample support 1 is mounted in the mass spectrometer 100 in a state where the surface 2b is located on the upper side with respect to the surface 2a. Subsequently, the surface 2b is irradiated with the laser light L while a voltage is applied to the conductive layer 6, so that the component S1 of the sample S is ionized. Here, the sample support 1 includes both the plurality of markers 32 and the plurality of markers 42. Each of the plurality of markers 32 indicates each of the plurality of openings 3c. Each of the plurality of markers 42 indicates each of the plurality of openings 4c. For this reason, when the solution is dripped from the surface 2a side, the measurement regions R can be recognized by recognizing the openings 3c through the markers 32, and thereafter, when the surface 2b is irradiated with the laser light L, the measurement regions R can be recognized by recognizing the openings 4c through the markers 42.

In addition, an example has been provided in which the sample support 1 includes the plurality of markers 32 and the plurality of markers 42, but the sample support 1 may not include one of the plurality of markers 32 and the plurality of markers 42. Namely, the sample support 1 may include at least one of the plurality of markers 32 and the plurality of markers 42.

In addition, as long as the conductive layer 6 is provided on at least the surface 2b of the substrate 2, the conductive layer 6 may be provided or not provided on the surface 2a of the substrate 2 and on an inner surface of each of the through-holes 2c.

In addition, the application of the sample support 1 is not limited to the ionization of the sample S by irradiation with the laser light L. The sample support 1 can be used for the ionization of the sample S by irradiation with an energy ray such as laser light, an ion beam, or an electron beam. In the ionization method and the mass spectrometry method described above, the sample S can be ionized by irradiation with an energy ray.

REFERENCE SIGNS LIST

1: sample support, 2: substrate, 2a: surface (first surface), 2b: surface (second surface), 2c: through-hole, 2d: first through-hole, 2e: second through-hole, 3: base (first member), 3a: surface, 3b: surface (third surface), 3c: opening (first opening), 3d: surface (fourth surface), 4: cover (second member), 4a: surface, 4b: surface, 4c: opening (second opening), 5: bonding member, 6: conductive layer, 6a: surface, 32: marker (first marker), 42: marker (second marker), D: direction (thickness direction), S: sample, S1: component.

The invention claimed is:

1. A sample support for ionizing a component of a sample, the support comprising:
    a substrate having a first surface, a second surface on a side opposite to the first surface, and a plurality of through-holes opening on the first surface and on the second surface;
    a first member having a plurality of first openings and disposed on the first surface;
    a second member having a plurality of second openings and disposed on the second surface, each of the plurality of second openings corresponding to each of the plurality of first openings in a thickness direction of the substrate;
    a bonding member disposed between the first member and the second member, and bonding the substrate and at least one of the first member and the second member; and
    a conductive layer integrally provided on a region of the second surface corresponding to each of the plurality of second openings, on a surface of the second member on a side opposite to the substrate, and on an inner surface of each of the plurality of second openings,
    wherein the plurality of through-holes include a plurality of first through-holes located between each of the plurality of first openings and each of the plurality of second openings, and a plurality of second through-holes located between the first member and the second member, and
    each of the plurality of second openings communicates with each of the plurality of first openings through the plurality of first through-holes.

2. The sample support according to claim 1,
    wherein the bonding member is disposed in the plurality of second through-holes.

3. The sample support according to claim 2,
    wherein the bonding member bonds the first member and the substrate between the plurality of first openings and bonds the second member and the substrate between the plurality of second openings.

4. The sample support according to claim 1,
    wherein each of the first member and the second member is made of a metal material.

5. The sample support according to claim 1,
    wherein the bonding member has conductivity.

6. The sample support according to claim 1,
    wherein the bonding member is made of a photocurable material.

7. The sample support according to claim 6,
    wherein the bonding member is made of an acrylic material or an epoxy material.

8. The sample support according to claim 1, further comprising:
    at least one of a plurality of first markers and a plurality of second markers, each of the plurality of first markers indicating each of the plurality of first openings when the first member is viewed from a side opposite to the substrate, each of the plurality of second markers indicating each of the plurality of second openings when the second member is viewed from a side opposite to the substrate.

9. The sample support according to claim 1,
    wherein the first member has a third surface on which the substrate is disposed, and a fourth surface located outside the substrate to face the same side as the third surface, and
    a distance between a surface of the conductive layer on a side opposite to the substrate and the fourth surface is smaller than a thickness of the substrate, the surface of the conductive layer is a surface of the conductive layer provided on the second surface.

10. The sample support according to claim 9,
    wherein the fourth surface extends to surround the substrate when viewed from the thickness direction.

11. The sample support according to claim 1,
    wherein an outer edge of each of the plurality of second openings is located inside an outer edge of each of the plurality of first openings when viewed from the thickness direction.

12. The sample support according to claim 1,
    wherein a thickness of the second member is smaller than a thickness of the first member.

* * * * *